(12) United States Patent
Detzel et al.

(10) Patent No.: US 10,446,469 B2
(45) Date of Patent: Oct. 15, 2019

(54) SEMICONDUCTOR DEVICE HAVING A COPPER ELEMENT AND METHOD OF FORMING A SEMICONDUCTOR DEVICE HAVING A COPPER ELEMENT

(71) Applicant: Infineon Technologies AG, Neubiberg (DE)

(72) Inventors: Thomas Detzel, Villach (AT); Johann Gross, Neutraubling (DE); Robert Illing, Villach (AT); Maximilian Krug, Zeitlarn (DE); Sven Gustav Lanzerstorfer, Feldkirchen (AT); Michael Nelhiebel, Villach (AT); Werner Robl, Regensburg (DE); Michael Rogalli, Rottenburg (DE); Stefan Woehlert, Villach (AT)

(73) Assignee: Infineon Technologies AG, Neubiberg (DE)

( * ) Notice: Subject to any disclaimer, the term of this patent is extended or adjusted under 35 U.S.C. 154(b) by 311 days.

(21) Appl. No.: 15/217,383

(22) Filed: Jul. 22, 2016

(65) Prior Publication Data
US 2016/0329263 A1 Nov. 10, 2016

Related U.S. Application Data

(62) Division of application No. 13/315,642, filed on Dec. 9, 2011, now Pat. No. 9,418,937.

(51) Int. Cl.
*H01L 23/00* (2006.01)
*H01L 23/373* (2006.01)
*H01L 23/532* (2006.01)
*H01L 21/288* (2006.01)
*H01L 21/48* (2006.01)

(52) U.S. Cl.
CPC ...... *H01L 23/3735* (2013.01); *H01L 21/2885* (2013.01); *H01L 21/4882* (2013.01); *H01L 23/53238* (2013.01); *H01L 2924/0002* (2013.01)

(58) Field of Classification Search
CPC ......... H01L 2924/0002; H01L 21/2885; H01L 21/4882
See application file for complete search history.

(56) References Cited

U.S. PATENT DOCUMENTS

| | | | |
|---|---|---|---|
| 5,631,498 A | 5/1997 | Anschel et al. | |
| 6,235,406 B1 | 5/2001 | Uzoh | |
| 6,790,773 B1 * | 9/2004 | Drewery | H01L 21/76843 257/E21.585 |

(Continued)

FOREIGN PATENT DOCUMENTS

| CN | 1719606 A | 1/2006 |
|---|---|---|
| CN | 101026927 A | 8/2007 |

(Continued)

*Primary Examiner* — Caridad Everhart
*Assistant Examiner* — Ankush K Singal
(74) *Attorney, Agent, or Firm* — Murphy, Bilak & Homiller, PLLC

(57) ABSTRACT

A semiconductor device includes a base element and a copper element over the base element. The copper element includes a layer stack having at least two copper layers and at least one intermediate conductive layer of a material different from copper. The at least two copper layers and the at least one intermediate conductive layer are alternately stacked over each other.

15 Claims, 6 Drawing Sheets

(56) References Cited

U.S. PATENT DOCUMENTS

| | | |
|---|---|---|
| 7,244,677 B2 | 7/2007 | Ritzdorf et al. |
| 7,335,288 B2 | 2/2008 | Hardikar |
| 7,872,130 B2 | 1/2011 | Brunner et al. |
| 2002/0015833 A1 | 2/2002 | Takahashi et al. |
| 2002/0033341 A1 | 3/2002 | Taylor et al. |
| 2003/0089519 A1 | 5/2003 | Okada et al. |
| 2005/0014355 A1 | 1/2005 | Chan et al. |
| 2006/0216930 A1 | 9/2006 | Feng et al. |
| 2007/0267749 A1* | 11/2007 | Stecher ............ H01L 21/76838 257/750 |
| 2008/0211098 A1 | 9/2008 | Suzuki et al. |
| 2009/0020321 A1* | 1/2009 | Schulz-Harder ...... C04B 37/025 174/256 |
| 2009/0038949 A1 | 2/2009 | Hayashi et al. |
| 2010/0255269 A1 | 10/2010 | Okamoto et al. |
| 2010/0323517 A1 | 12/2010 | Baker-O'Neal et al. |
| 2010/0330025 A1 | 12/2010 | Messersmith et al. |
| 2011/0011746 A1 | 1/2011 | Brunner et al. |
| 2011/0121458 A1 | 5/2011 | Siepe et al. |
| 2011/0260317 A1 | 10/2011 | Lu et al. |
| 2011/0265917 A1 | 11/2011 | Oishi |
| 2013/0043593 A1* | 2/2013 | Domes ................ H01L 23/3735 257/758 |
| 2015/0054159 A1* | 2/2015 | Hoegerl ............. H01L 23/3735 257/762 |

FOREIGN PATENT DOCUMENTS

| | | |
|---|---|---|
| CN | 101102639 A | 1/2008 |
| DE | 10309085 A1 | 12/2003 |
| DE | 10261852 B3 | 6/2004 |
| EP | 2113587 B1 | 4/2011 |
| JP | 2000208881 A | 7/2000 |
| JP | 2007317782 A | 12/2007 |

\* cited by examiner

SEMICONDUCTOR DEVICE HAVING A COPPER ELEMENT AND METHOD OF FORMING A SEMICONDUCTOR DEVICE HAVING A COPPER ELEMENT

TECHNICAL FIELD

The present application relates to an integrated circuit and to a method for manufacturing an integrated circuit.

BACKGROUND

In the field of the semiconductor devices thin metal layers such as aluminum or copper layers are widely used for forming wiring layers of integrated circuits.

In the field of power devices, comparatively thick metal layers, for example of copper or aluminum are used. Thick metal layers may be efficiently used for discharging large currents or leading off a large amount of heat that may be generated due to a short-circuit, for example.

For example, for so-called power metallizations, thicknesses of the wiring of more than 2 µm and even more than 5 µm have been employed. Nevertheless, in integrated circuits having a wiring of such a large thickness fatigue has increasingly been observed. In particular, it has been observed that metal wirings tend to delaminate from the base element and increasingly show cracks so that these integrated circuits exhibit deterioration during thermal or electrical loading.

Accordingly, there is a need of improving integrated circuits comprising a copper element which solves the above-mentioned problems.

SUMMARY

According to an embodiment of an integrated circuit, the integrated circuit comprises a base element and a copper element over the base element, the copper element having a thickness of at least 5 µm and a ratio of average grain size to thickness of less than 0.7.

According to an embodiment of a method of manufacturing an integrated circuit, the method comprises forming a copper element over a base element, so that the copper element has a thickness of at least 5 µm and a ratio of average grain size to thickness of less than 0.7.

According to a further embodiment of an integrated circuit, the integrated circuit comprises a base element and a copper element over the base element, the copper element comprising a layer stack including at least two copper layers and at least one intermediate conductive layer of a material different from copper, the copper layers and the intermediate conductive layers being alternately stacked over each other.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

It is to be understood that the features of the various exemplary embodiments described herein will be combined with each other, unless specifically noted otherwise.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide.

Further examples of semiconductor materials comprise gallium nitride, aluminum nitride, aluminum gallium nitride, indium nitride, indium gallium nitride, indium aluminum nitride, indium aluminum gallium nitride, silicon carbide, any other III-V or II-VI semiconductor, or any other compound semiconductor either as bulk material or grown on a substrate.

Figure 1A:
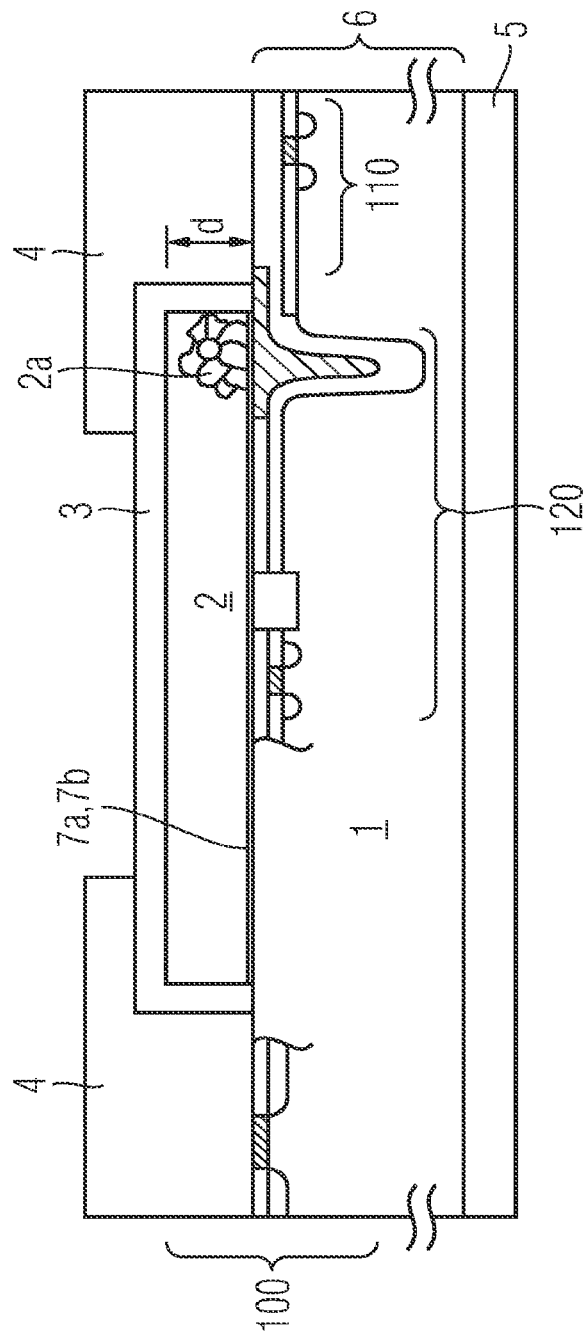
FIG. 1A shows an example of a cross-sectional view of an integrated circuit according to an embodiment.

FIG. 1A illustrates a cross-sectional view of an embodiment of an integrated circuit 100.

In a semiconductor substrate 1 a plurality of components of electronic circuits may be formed to form a base element 6. For example, as is shown in FIG. 1A an integrated circuit that is formed in or on a surface region of the semiconductor substrate 1 may comprise a first region 120 and a second region 110. For example, the first region 120 may comprise several components of a DMOS (double-diffused metal-oxide-semiconductor) area or a power device area and the second region 110 may comprise several components of a logic area of a power device. For example, these components may comprise transistors and others as is generally known in the art. For example, power transistors or power devices may be disposed in the first region 120. The components of the first and second regions 120, 110 may comprise doped semiconductor portions, undoped semiconductor portions, dielectric portions and conductive portions including metal portions.

Over a part of the semiconductor substrate 1, a copper element 2 that is made of copper (Cu) is formed. For example, the copper element 2 may be a layer or a portion of a layer. For example, the copper element 2 may be a patterned copper layer comprising a wiring line or any other patterned structure. The copper element 2 may have a thickness d. The thickness d of the copper layer need not be uniform but may have a varying thickness. In the context of the present specification, it is intended that the thickness d relates to the maximum thickness of the copper layer.

Various intermediate layers may be disposed between the copper element 2 and the semiconductor substrate 1. For example, further metallization layers may be disposed between the copper element 2 and the semiconductor substrate 1. Moreover, additional metallization layers may be disposed over the copper element 2. These metallization layers may comprise any suitable metal. Further, a seed layer 7b and/or a barrier layer 7a as are generally used may be disposed between the semiconductor substrate 1 and the copper element 2. Examples of the barrier layer 7a comprise a TiW layer, having a thickness of 50 to 300 nm, for example, and examples of the seed layer 7b comprise a thin copper layer having a thickness of 50 to 300 nm. Alternatively, the seed layer 7b may comprise another suitable seed material for an electroplating process such as palladium (Pd). Over the copper element 2, a hard layer 3 which may comprise NiP, NiMoP, Ni, Ni(X)P, Ni(X,Y)P or any combination thereof may be formed. For example, Ni(X)P relates to an arbitrary ternary system such as NiWP and Ni(X,Y)P relates to an arbitrary quaternary system, where X and Y denote arbitrary elements. For example, the hard layer 3 may comprise a layer stack including any of these materials. On top of the hard layer 3 a Pd layer may be deposited. The Pd layer may have a thickness of approximately 100 to 500 nm. The hard layer 3 including the Pd layer may have a thickness of approximately 500 nm to 5 µm, for example, 1 µm. The hard layer 3 including the Pd layer protects the copper element 2 from corrosion and may serve as a bonding interface. As is shown in the embodiment of FIG. 1A, the hard layer 3 may be formed so as to cover the whole surface as well as the side walls of the copper element 2.

Figure 1B:
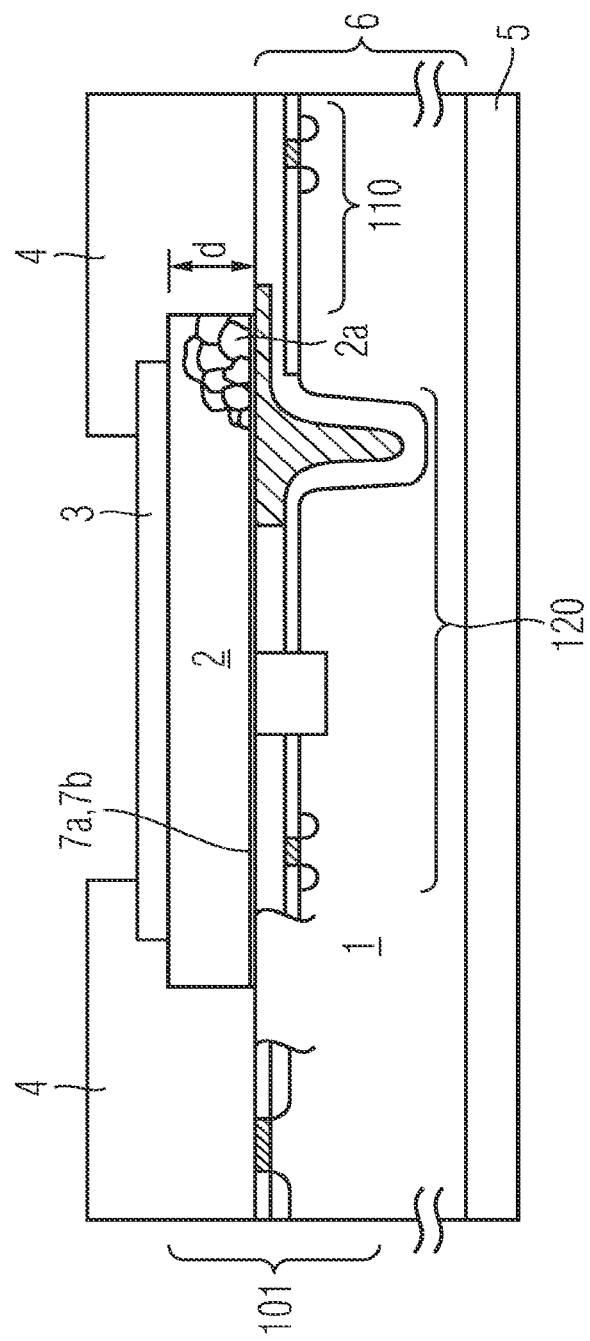
FIG. 1B is a further cross-sectional view of a further example of an integrated circuit according to an embodiment.

Alternatively, as is shown in FIG. 1B, the hard layer 3 may be disposed over a portion of the copper element 2. FIG. 1B shows a cross-sectional view of an embodiment of an integrated circuit 101 comprising the same elements as the integrated circuit 100 illustrated in FIG. 1A. Nevertheless, in FIG. 1B the hard layer 3 only covers a part of the copper element 2. Accordingly, a portion of the surface of the copper element 2 as well as the sidewalls thereof are uncovered or in contact with a material different from the hard layer 3. Nevertheless, as is readily to be understood, embodiments of the application also comprise integrated circuits without a hard layer.

In the embodiments of FIG. 1A and FIG. 1B, portions of a passivation layer 4 may be disposed over portions of the copper element 2 and over portions of the hard layer 3. The passivation layer 4 may, for example, comprise insulating materials such as imide, silicon nitride, silicon oxide and others as well as combinations of these materials. In the embodiment of FIG. 1B a portion of the copper element 2 is in contact with the passivation layer 4. In the embodiment of FIG. 1A, the copper element 2 does not contact the passivation layer 4, but instead a hard layer 3 is disposed between the copper element 2 and the passivation layer 4.

When analyzing a copper metallization layer using, for example, Electron Back-Scattering Diffraction (EBSD) technology, grain boundaries and corresponding grains 2a of the copper layer are detected. Generally, it has been observed that with increasing layer thicknesses of the copper layer, also the grain size of the copper increases. As has been determined by the inventors, the reliability of the copper element 2 depends on the grain size of the copper grains 2a. In more detail, it has been observed, that in a range of the thickness of more than about 5 µm the reliability of the copper element 2 is improved, when the grain size of the copper layer is much smaller than the layer thickness of the copper element 2. Looking at a grain size distribution of copper grains in a copper film having a thickness of at least 5 µm, conventionally there are individual grains which have a grain size which is approximately equal to the thickness of the copper film and which penetrate the entire film thickness. It has been observed that the mechanical stability of these copper layers is deteriorated.

According to embodiments of the application, even the largest grains are always smaller than the film thickness. For example, the average size of the grains 2a of the copper element 2 illustrated in FIGS. 1A and 1B is set such that the ratio of the largest grain size and the layer thickness d is less than 0.7 or less than 0.55. Moreover, the thickness of the copper element 2 is at least 5 µm, for example, at least 7.5 µm and even more than 10 or 20 µm. The thickness of the copper element 2 may be less than 100 µm. The integrated circuit 100, 101 shown in FIGS. 1A and 1B comprises a copper element 2 having comparatively small grain sizes. For example, the grain size is less than 4.0 µm or even less than 3.5 µm. In this respect, the grain size refers to the diameter of the grains 2a. For example, the grain size may be measured using an EBSD (Electron Back-Scatter Diffraction) technique as is commonly used. For assessing the grain sizes using the EBSD technique, EBSD measurements have been conducted in a scanning electron microscope of type Leo Gemini using an acceleration voltage of 20 kV. All lines in the EBSD images of the surface of the samples were determined to be grain boundaries which involved a change in grain orientation of more than 3°. From the area of these grains a circle (disk) with equivalent area is determined. The diameter of this area equivalent circle (disk) is defined as the grain size. Twin grain boundaries are included in the grain boundary statistics. The average grain size is determined from the lognormal distribution of the individual grain sizes.

As will be explained in the following, this integrated circuit exhibits improved mechanical properties. According to embodiments, the copper film comprises chloride, sulfur and further incorporations or admixtures such as hydrogen, oxygen or carbon, and the amount of chloride is larger than any amount of the other additives. For example, the amount of chloride may be determined using TOF-SIMS ("time-of-flight secondary ion mass spectroscopy"). For example, the copper signal normalized signal of chloride may be more than 1.25% or even more than 1.5%. In this respect, the term "copper signal normalized signal of chloride" means the ratio of the TOF-SIMS signal of chloride and the TOF-SIMS signal of copper. The copper signal normalized TOF-SIMS signal of sulfur may be more than 0.075% or even more than 0.1%.

Experiments have been conducted to evaluate the properties of an integrated circuit having a film thickness of the copper element 2 of 5 µm, 10 µm, and 20 µm. The average grain size in all these examples was less than 3.5 µm. By way of example, the average grain size of a 5 µm thick film was 2.4 µm, the average grain size of a 10 µm thick film was 2.6 µm, and the average grain size of a 20 µm film was 3.1 µm. Moreover, the average grain size of the grains of the copper element 2 was approximately independent from the film thickness of the copper element 2. For example, the increase of the average grain size with increasing film thickness is less than 10%. In the distribution of the grain size, which has been measured for different film thicknesses of the copper element 2, it has been determined that a mode or a modal value, i.e. the value that occurs most frequently in the grain size distribution is about 2 µm for a thickness of 5 µm, 3 µm for a thickness of 10 µm and about 3 µm for a thickness of about 20 µm. In other words, this value does not significantly shift for increasing thicknesses of the copper element 2. In contrast, in conventional copper elements, the mode increases with increasing film thickness of the copper element. For these examples, it has been shown that cracks are less likely to occur and that a delamination of the copper element 2 from the barrier layer 7a and the seed layer 7b and, thus, the base element 6 could be prevented. In particular, it has been shown that even after a thermal stress and a current stress, the power metallization excellently adheres to the barrier layer 7a. As a consequence, a good electrical and thermal contact between the base element 6 and the copper element 2 is accomplished. Due to the improved contact, current and heat can be transferred very efficiently from the integrated circuit 100, 101. As a consequence, the first region 120 can be decreased in comparison with conventional integrated circuits, i.e. integrated circuit in which the ratio of average grain size to thickness of the copper grains/copper layer has not been controlled to be less than 0.7.

A further metallization layer 5 may be disposed on the back side of the semiconductor substrate 1. For example, this metallization 5 may be formed in the same manner as the copper element 2 and may have the same structure.

Figure 2:
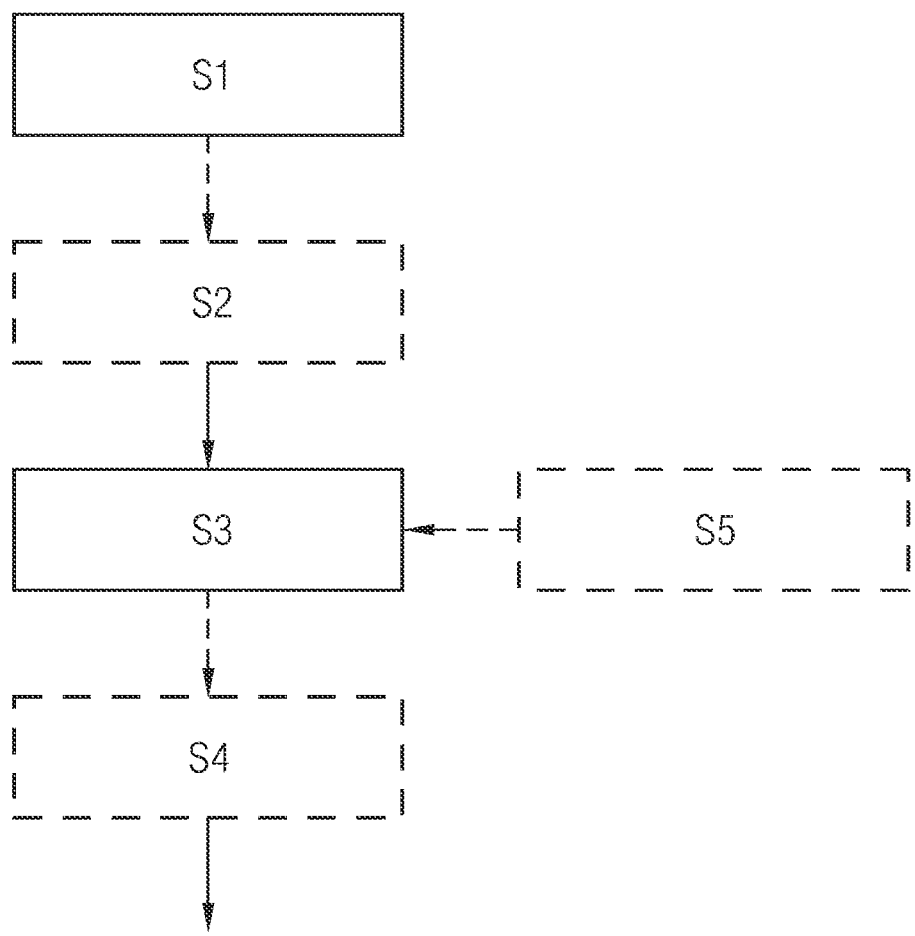
FIG. 2 shows a schematic diagram of a method of forming an integrated circuit according to an embodiment.

FIG. 2 schematically illustrates a method of forming an integrated circuit according to an embodiment. In step S1, several components of electronic circuits are provided on a semiconductor substrate 1. For example, the several devices shown in the first region 120 and in the second region 110 shown in FIGS. 1A and 1B may be formed by conventional processes. Metallization layers may be formed over the semiconductor substrate 1. Thereafter, in step S2 a barrier layer 7a which may be made of TiW may be formed, followed by a seed layer 7b which may be made of copper having a thickness of approximately 150 nm. These layers 7a, 7b may be formed by PVD (physical vapor deposition) as is conventional. Forming the barrier layer 7a and the seed layer 7b may be optional.

Thereafter, in step S3, a copper layer 2 may be formed, for example by electroplating. For example, an electrolyte comprising 100 g/l $H_2SO_4$, 50 g/l Cu and, as an additive, 50 ppm chloride may be used. As is indicated by step S5, further additives may be added. For example, the additives may comprise a brightener that may be SPS (Bis (Natrium-3-sulfopropyl)-disulfide)$(S(CH_2)_3SO_3Na)_2$. A further example comprises MPSA/MPS (mercapto-1-propanesulfonic acid, $HS(CH_2)_3SO_3$. Further, a so-called carrier may be used which may comprise PEG (polyethylene glycol) (HO$[C_2H_4O]_nH$) or PPG (polypropylene glycol) (HO$[C_3H_6O]_n$H). Further, the additives may comprise a so-called leveler comprising JGB (Janus Green B ($C_{30}H_{31}N_6Cl$)), DB (diacine black ($C_{28}H_{26}ON_5Cl$)) or BTA (benzotriazole ($C_6H_5N_3$)). The chloride may be taken, for example, from the group consisting of KCl, NaCl, HCl. Typically, the amount of chloride may be 30 to 100 ppm. The electroplating is accomplished using common processes. For example, a deposition rate may be approximately 0.2 to 2 µm/min, in particular 0.6 to 1.3 µm/min. For example, the additives and the content of the additives may be selected so as to accomplish a growth of copper grains so that the resulting grain sizes are as discussed above with reference to FIGS. 1A and 1B. In other words, the additives and the content of the additives are selected so that a growth of the grains is suppressed. Further, dispersion layers or dispersion substances may be used for achieving these grain sizes. Examples of suitable dispersion substances comprise carbon nano tubes, diamond (nano) particles, and alumina (nano) particles or SiC (nano) particles. According to a further modification, alloy components may be selected in order to achieve these grain sizes. Examples for suitable alloy components comprise Fe, Ni, Mn, Ag, Ce, Mg, and others. For example, DC current may be used for performing electroplating.

For example, electroplating may be performed using an electrolyte, for example an aqueous or a non-aqueous electrolyte. According to an embodiment, the electrolyte may comprise copper sulfate, sulfuric acid, hydrochloric acid and at least one organic additive. According to a further embodiment, the electrolyte may comprise copper sulfate, MSA (methylsulfonic acid), hydrochloric acid and at least one organic additive.

According to an embodiment, electroplating may be performed using ionic liquids. According to a further embodiment, the copper element may be deposited electrolessly.

According to an embodiment, electroplating is performed using an electrolyte comprising copper, at least one organic additive and an admixture selected from the group consisting of chloride (Cl), sulfur (S) and at least one organic additive.

According to an embodiment, the current during electroplating may be a pulsed current which may be formed by cathodically pulsing the current or it may be a cathodically pulsed current with short anodic pulses. According to embodiments, the current during electroplating may also be a combination of all current forms, like pulsed current to build up a certain thickness followed by DC current or pulse reverse current, or start with pulse reverse current to a certain thickness and finish with DC current or pulsed current, and may comprise all combinations of pulse forms. As has been found out, pulse current and pulse reverse current during electroplating can result in the incorporation of more additives which hinder the grain growth during anneal. As a result, small grains may be present even after anneal. In other words, by suitably selecting a waveform of the pulses, the incorporation of additives and the grain size of the copper layer may be influenced.

The electroplating is performed until the copper layer has a thickness of 5 to 30 μm. Nevertheless, as is to be clearly understood, the copper layer may also be deposited so as to have a larger thickness. Moreover, the copper element 2 may be formed so that it is in contact with several wiring layers beneath.

For example, these wiring layers may be buried within the semiconductor substrate 1. Thereafter, a hard layer may be formed over the copper element 2. For example, the hard layer may comprise NiP, NiMoP, Ni or a combination thereof, including a thin Pd layer on top. The copper layer may also be patterned as is conventional. For example, a damascene technique may be employed which comprises patterning a dielectric layer to form a recess and depositing the copper layer in the recess formed in the dielectric layer, followed by CMP (chemical mechanical polishing step). Alternatively, the copper layer may also be patterned by etching as is conventional. According to a further embodiment, the pattern plating technique may be employed. The pattern plating technique uses a resist mask and copper material is deposited only in resist openings, i.e. in those portions which are not covered by a resist material. Thereafter, in step S4, a further protection layer may be formed over the integrated circuit. For example, the protective layer may be made of imide 4 as is conventional. Forming the protection layer is optional.

Although it has been shown in FIGS. 1A and 1B that the copper element 2 is formed on top of the semiconductor substrate 1 in which the electronic components are formed, it is clearly to be understood that the copper element 2 may also be formed on the back side of the integrated circuit. For example, if the copper element is disposed on the back side of the semiconductor substrate 1, the thickness may be even larger than 20 μm, for example up to a thickness of 200 μm. The resulting electrical conductive back side is contacted to the active area on the front side either with through silicon vias, which may be filled with a conductive material such as doped poly silicon, Cu or W, or with a metal such as Al or Ti forming an ohmic contact to the silicon.

Figure 3A:
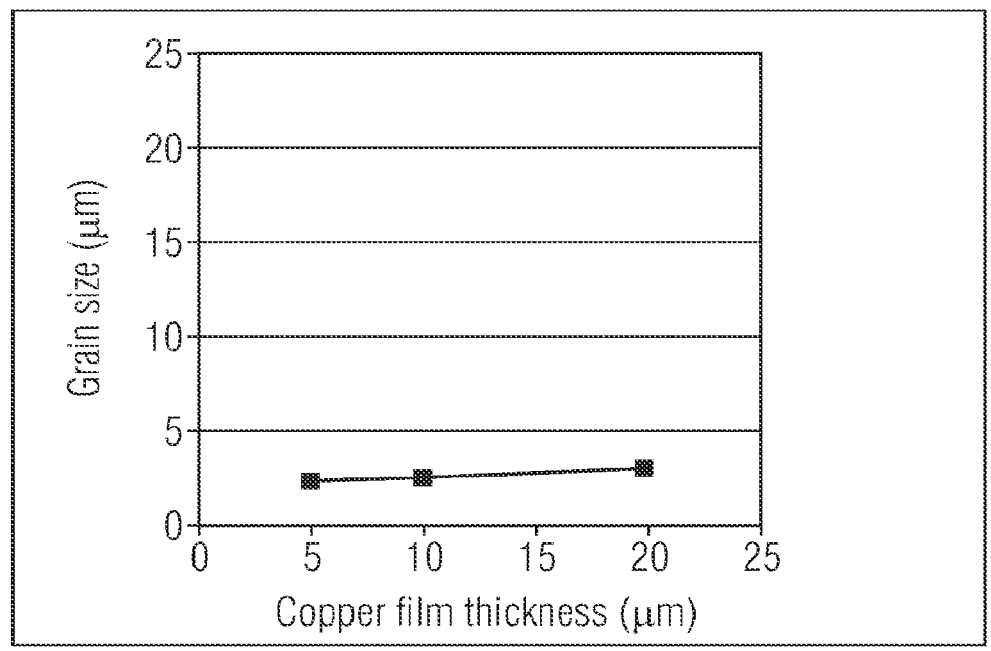
FIG. 3A is a chart illustrating average grain size in dependence from the layer thickness of the copper element that is a component of an integrated circuit according to an embodiment.

FIG. 3A is a chart illustrating the average grain size of the copper element 2 in dependence from the layer thickness. In conventional integrated circuits, the average grain size increases with increasing layer thickness. For example, during the manufacture of conventional integrated circuits no measures are taken in order to suppress the growth of the grain boundaries. FIG. 3A illustrates the average grain size of the copper element 2 in comparison with the layer thickness in an integrated circuit according to an embodiment. As is shown in FIG. 3A, according to an embodiment, the average grain size is approximately independent from the layer thickness. The average grain size is less than 3.5 μm, and in the embodiment of FIG. 3A the thickness of the copper element is more than 5 μm. The grain size was measured after annealing the samples at 400° C. for 30 min in a reducing atmosphere. It has been observed that the grain size does not substantially increase when the sample is annealed. According to an embodiment, the method further comprises annealing the copper element 2, wherein due to the annealing the grain size increases by less than 10%, for example, less than 5%. The average grain size shown in FIG. 3A has been measured using the EBSD method which was explained above. In FIG. 3A, the average grain size of a 5 μm thick film was 2.4 μm, the average grain size of a 10 μm thick film was 2.6 μm, and the average grain size of a 20 μm film was 3.1 μm. Moreover, the increase of the average grain size with increasing film thickness was less than 5%. The standard deviation of the average grain size for a film thickness of 5 μm is about 0.8 μm, the standard deviation for a film thickness of about 10 μm is 0.8 μm, and the standard deviation for a film thickness of 20 μm is 1.0 μm. Accordingly, when comparing these values with conventional copper elements, the standard deviation does not substantially increase with the film thickness. Moreover, it has been observed that the mode, i.e. the value that occurs most frequently in the distribution of the grain sizes in dependence from the thickness, is about 2 μm for a film thickness of 5 μm, the mode for a film thickness of 10 μm is about 3 μm, and the mode for a film thickness of 20 μm is between 2 and 3 μm. In comparison, for conventional copper elements, the mode increases with the increasing film thickness. Further, for all analyzed film thicknesses, the ratio of grain sizes larger than 4 μm is very small in comparison to grains having a grain size of less than 4 μm. In a similar manner, the ratio of grains having a size larger than 5 μm is much smaller than the ration of grains having a size smaller than 5 μm.

Figure 3B:
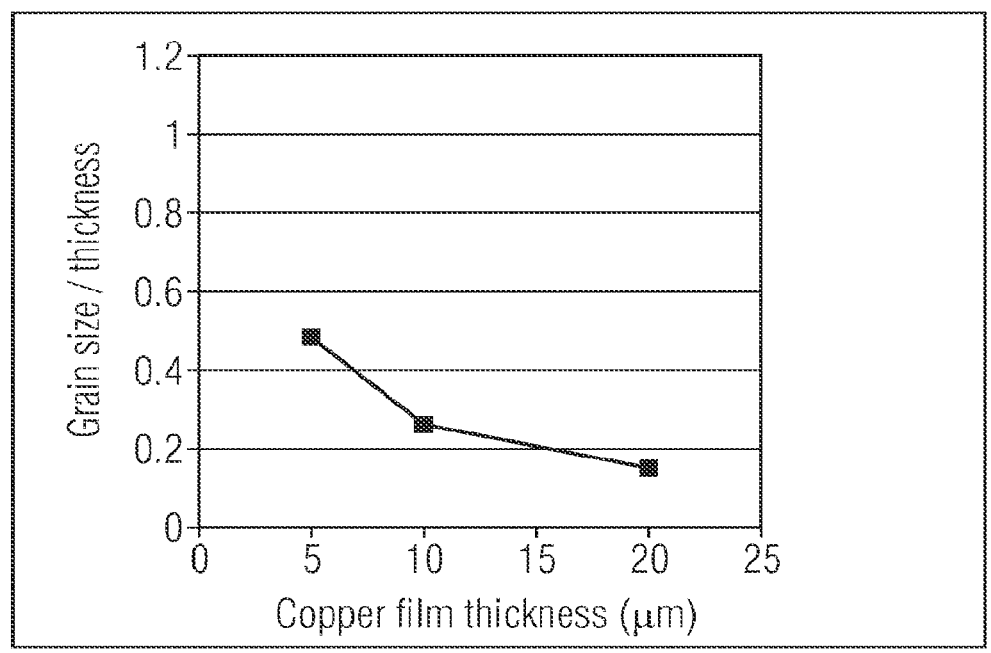
FIG. 3B is a chart illustrating the ratio of average grain size to the layer thickness in dependence from the layer thickness of the copper element that is a component of an integrated circuit according to an embodiment.

FIG. 3B shows the ratio of the grain size to the copper film thickness calculated from the measurement values shown in FIG. 3A, the ratio being plotted in dependence from the film thickness. As is shown, with increasing film thickness this ratio decreases.

EXAMPLE

Thick copper films for power applications were deposited using pattern plating technology. After sputtering a barrier (e.g. TiW) and a seed layer (e.g. Cu) a resist was applied on the wafer. The resist was patterned and copper was electroplated into the resist mask. In the next process steps the resist was removed and the seed layer and the barrier layer were wet chemically etched, forming copper lines and areas. The copper was electroplated from an aqueous based copper bath containing sulfuric acid, copper sulfate and hydrochloric acid. In order to improve the surface roughness and thickness uniformity organic additives were added to the plating solution. Three types of additive were added to the plating bath: an accelerator (brightener), e.g. SPS, which contains sulfur; a suppressor (carrier), e.g. PEG, which builds a complex with the chlorine and the Cu ions; and a leveler, e.g. Janus Green. Since the accelerator contains sulfur and the suppressor builds a complex with the chlorine in the bath the amount of sulfur and chlorine can be a measure of the incorporation of accelerator or suppressor in the copper film.

The incorporation of the additives was measured using TOF-SIMS ("time-of-flight secondary ion mass spectroscopy") analysis. From this analysis it can be seen that approximately 19× more sulfur and 55× chlorine was incorporated into the copper film than in conventional copper films which are manufactured using standard electrolytes. This is a strong indication that much more accelerator (represented by S) and suppressor (represented by Cl) were incorporated into the copper which is deposited with the new electrolyte.

It has been determined that the incorporation of accelerator and suppressor influences the grain size of the copper films. Thereafter, an anneal was performed in a furnace at 400° C. for 30 min in a forming gas atmosphere, i.e. a gas atmosphere including hydrogen and nitrogen gas.

Figure 4:
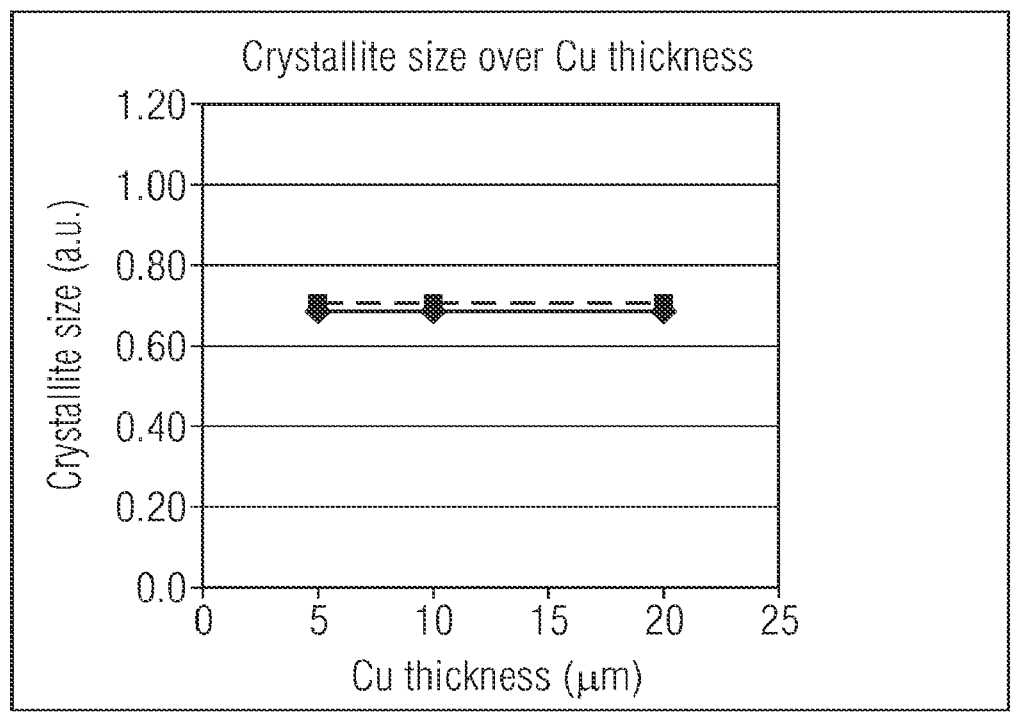
FIG. 4 is a chart illustrating average grain size in dependence from the layer thickness of the copper element before and after annealing, the copper element being a component of an integrated circuit according to an example.

FIG. 4 illustrates the grain size of the Example before and after the anneal in arbitrary units, wherein the broken line indicates the grain size after the anneal and the solid line indicates the grain size before the anneal. The grain or crystallite sizes of FIG. 4 have been measured with XRD (X-ray diffraction).

As can be seen from FIG. 4, in embodiments in which copper films were deposited with the electrolyte according to the example described above the crystallite size was approximately constant over all measured Cu thicknesses and annealing increases the Cu grain size only marginally by an amount of less than 4%.

Summarizing, in copper deposited with the conventional electrolyte low additive incorporation is observed. Crystallites can grow without severe obstacles. Using the electrolyte according to the example described above a significant amount of additives are incorporated in the film. This results in a constant crystallite size distribution over all considered Cu thicknesses. Grain growth is inhibited and the incorporated additives inhibit the grain growth even during annealing of the samples.

Figure 5:
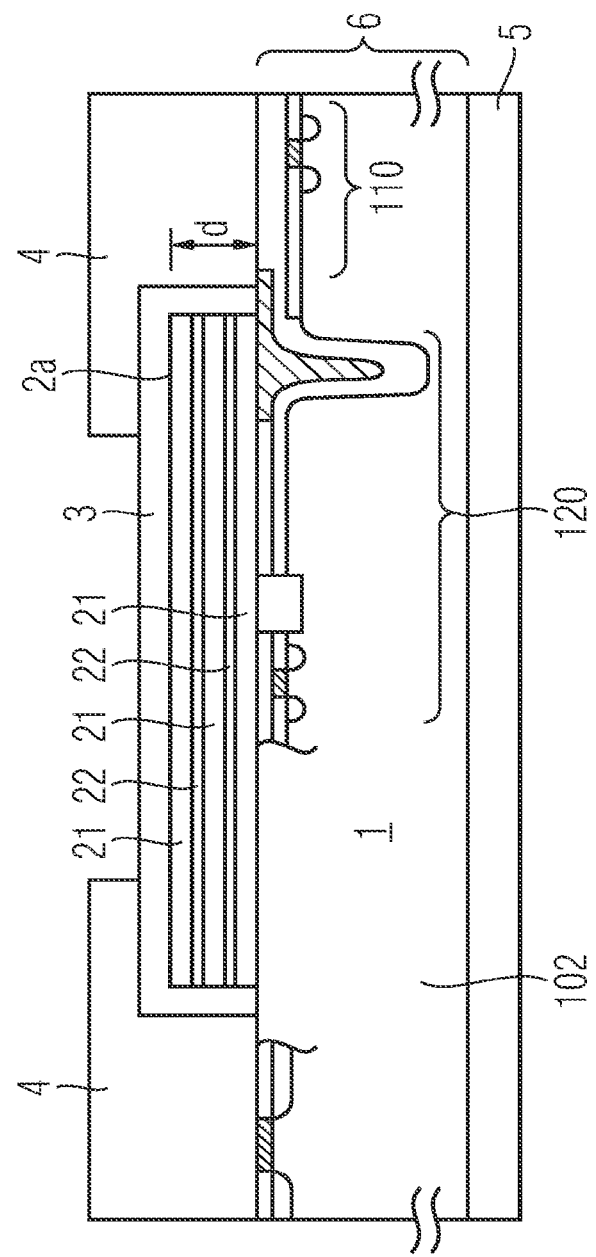
FIG. 5 shows a cross-sectional view of an integrated circuit according to still a further embodiment.

FIG. 5 shows a further embodiment of the integrated circuit 102. The integrated circuit 102 shown in FIG. 5 comprises the same components as the integrated circuit shown in FIGS. 1A and 1B. Nevertheless, the copper element 2a comprises several single layers 21 which may be made of copper (Cu) and further conductive intermediate layers 22 which may be of TiN, for example, the intermediate layers 22 being disposed between the copper layers 21. For example, the thickness of the single copper layers 21 may be about 300 nm to 5 μm, for example 400 nm. For example, the thickness of the single copper layers 21 may not be less than approximately 50 nm. Further, the thickness of the intermediate layers 22 may be approximately 10 to 20 nm, but not less than 3 nm. For example, three to four single layers of copper 21 may be alternately arranged to form the copper element 2a.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a base element; and
a copper element over the base element, the copper element comprising a layer stack including at least two copper layers and at least one intermediate conductive layer of a material different from copper, the at least two copper layers and the at least one intermediate conductive layer being alternately stacked over each other, each of the at least one intermediate layer having a thickness of less than 30 nm.

2. The semiconductor device of claim 1, wherein each of the at least two copper layers has a thickness of less than 5 μm.

3. The semiconductor device of claim 1, further comprising a cover layer comprising at least one of NiP, NiMoP, NiPd, Ni(X)P, and Ni(X,Y)P, wherein X and Y denote further elements.

4. The semiconductor device of claim 1, wherein the copper element is a layer, a patterned layer or a wiring.

5. A semiconductor device, comprising:
a semiconductor substrate;
components of a power device disposed in the semiconductor substrate; and
a copper element over the semiconductor substrate and electrically connected to one of the components, the copper element comprising a layer stack including at least two copper layers and at least one intermediate conductive layer of a material different from copper, the at least two copper layers and the at least one intermediate conductive layer being alternately stacked over each other, each of the at least one intermediate layer having a thickness of less than 30 nm.

6. The semiconductor device of claim 5, wherein each of the at least two copper layers has a thickness of less than 5 μm.

7. The semiconductor device of claim 5, further comprising a cover layer comprising at least one of NiP, NiMoP, NiPd, Ni(X)P, and Ni(X,Y)P, wherein X and Y denote further elements.

8. The semiconductor device of claim 5, wherein the copper element is a layer, a patterned layer or a wiring.

9. The semiconductor device of claim 5, wherein the power device is a power transistor.

10. A method of manufacturing a semiconductor device, the method comprising:
forming a copper element over a base element, by forming a layer stack including at least two copper layers and at least one intermediate conductive layer of a material different from copper, the at least two copper layers and the at least one intermediate conductive layer being alternately stacked over each other, each of the at least one intermediate layer having a thickness of less than 30 nm.

11. The method of claim 10, wherein each of the at least two copper layers has a thickness of less than 5 μm.

12. The method of claim 10, further comprising:
forming a cover layer comprising at least one of NiP, NiMoP, NiPd, Ni(X)P, and Ni(X,Y)P, wherein X and Y denote further elements.

13. The semiconductor device according to claim 1, wherein the conductive intermediate layer comprises TiN.

14. The semiconductor device according to claim 5, wherein the conductive intermediate layer comprises TiN.

15. The method of claim 10, wherein the conductive intermediate layer comprises TiN.

* * * * *